(12) United States Patent
Panine (10) Patent No.: US 11,099,216 B2
(45) Date of Patent: Aug. 24, 2021

(54) CIRCUIT AND METHOD FOR SHUNT CURRENT SENSING

(71) Applicant: Kongsberg Inc., Shawinigan (CA)

(72) Inventor: Nikolai Panine, Quebec (CA)

(73) Assignee: Kongsberg Inc., Shawinigan (CA)

( * ) Notice: Subject to any disclaimer, the term of this patent is extended or adjusted under 35 U.S.C. 154(b) by 0 days.

(21) Appl. No.: 16/071,264

(22) PCT Filed: Mar. 3, 2016

(86) PCT No.: PCT/IB2016/051210
§ 371 (c)(1),
(2) Date: Jul. 19, 2018

(87) PCT Pub. No.: WO2017/149359
PCT Pub. Date: Sep. 8, 2017

(65) Prior Publication Data
US 2019/0339304 A1    Nov. 7, 2019

(51) Int. Cl.
*G01R 15/14*      (2006.01)
*G01R 19/00*      (2006.01)

(52) U.S. Cl.
CPC ....... *G01R 15/146* (2013.01); *G01R 19/0092* (2013.01)

(58) Field of Classification Search
CPC .. G01R 15/146; G01R 19/0092; G01R 1/203; G01R 19/0007
USPC ...................................................... 324/126
See application file for complete search history.

(56) References Cited

U.S. PATENT DOCUMENTS

| | | | | |
|---|---|---|---|---|
| 4,788,493 A * | 11/1988 | Liptak | .................... | G01R 19/14 318/376 |
| 4,945,445 A * | 7/1990 | Schmerda | .......... | H03K 17/0822 361/101 |
| 6,249,447 B1 * | 6/2001 | Boylan | .............. | G01R 19/0092 363/131 |
| 6,549,014 B1 * | 4/2003 | Kutkut | .................. | G01R 1/203 324/426 |

(Continued)

OTHER PUBLICATIONS

Maxim Integrated, MAX9939: SPI-Programmable Gain Amplifier (PGA) with Input V OS Trim and Output Op Amp, available at https://web.archive.org/web/20140712010128/https://www.maximintegrated.com/en/products/analog/amplifiers/MAX9939.html (Year: 2014).*

(Continued)

*Primary Examiner* — Tung X Nguyen
*Assistant Examiner* — Robert P Alejnikov, Jr.
(74) *Attorney, Agent, or Firm* — Howard & Howard Attorneys PLLC (57) ABSTRACT

Circuits and methods relating to shunt current sensing are provided. A shunt current sensing circuit comprises a shunt resistor for receiving a shunt current. A filtering stage is connected to the shunt resistor and is configured to filter the shunt current. A current sense amplifier is connected to the filtering stage and is configured to receive the filtered shunt current from the filtering stage. The current sense amplifier is configured to sense the filtered shunt current to produce an output voltage. The filtering stage is configured to filter the shunt current such that the output voltage produced by the current sense amplifier (U2) is substantially proportional to the shunt current.

20 Claims, 5 Drawing Sheets

(56) References Cited

U.S. PATENT DOCUMENTS

| | | | | |
|---|---|---|---|---|
| 8,604,777 B2* | 12/2013 | Doogue | ............... | G01R 15/148 |
| | | | | 323/277 |
| 2003/0025514 A1* | 2/2003 | Benes | .................... | G01R 15/09 |
| | | | | 324/713 |
| 2003/0155930 A1* | 8/2003 | Thomsen | ........... | G01R 19/0092 |
| | | | | 324/522 |
| 2013/0009655 A1* | 1/2013 | Marten | .................. | G01R 1/203 |
| | | | | 324/713 |
| 2014/0125429 A1* | 5/2014 | Yoshioka | ................. | H01C 1/14 |
| | | | | 333/172 |
| 2014/0152293 A1* | 6/2014 | Hsieh | ................. | G01R 19/0007 |
| | | | | 324/76.44 |
| 2014/0253109 A1* | 9/2014 | Singh | .................... | G01R 15/20 |
| | | | | 324/227 |
| 2015/0034952 A1* | 2/2015 | Yataka | ................. | H03K 17/164 |
| | | | | 257/48 |
| 2015/0270840 A1* | 9/2015 | Itakura | ................... | G01R 19/15 |
| | | | | 377/19 |
| 2015/0276812 A1* | 10/2015 | Ferguson | ............... | H03F 3/343 |
| | | | | 324/123 R |
| 2015/0381198 A1* | 12/2015 | Lasseuguette | ..... | G01R 19/2509 |
| | | | | 341/143 |
| 2016/0125993 A1* | 5/2016 | Narayanasamy | .... | G01D 5/2006 |
| | | | | 361/160 |

OTHER PUBLICATIONS

International Search Report for PCT/IB2016/051210, dated Dec. 7, 2016; 9 pages.

\* cited by examiner

CIRCUIT AND METHOD FOR SHUNT CURRENT SENSING

CROSS REFERENCE TO RELATED APPLICATIONS

This application is the U.S. National Stage of International Patent Application No. PCT/IB2016/051210, filed on Mar. 3, 2016, the disclosure of which is hereby incorporated by reference.

BACKGROUND

1. Field of the Invention

The subject invention relates to circuits and methods for shunt current sensing.

2. Description of Related Art

Electrical or electronic systems commonly sense and control electrical current flow. For example, a battery charger controls a charging current provided to a charging battery. Overcharging of the battery may damage the battery or reduce battery life. A precision current sense amplifier is typically employed in the battery charger circuit to monitor charging current provided to the battery. Typically, a shunt resistor is placed between the battery charger circuit and the battery for monitoring the charging current. The voltage across the shunt resistor is measured and the current sense amplifier amplifies such voltage to provide a feedback signal (output voltage) corresponding to the charging current.

One major limitation in such conventional shunt current sensing techniques is that sensing works properly only when the current through the shunt resistor is constant or changes with only low or minimal speed (dI/dt). Fast current switching, such as current switching used in high frequency Pulse Width Modulation (PWM), disturbs the voltage across the shunt resistor by introducing parasitic inductance and capacitance. Such parasitic inductance reactions cause voltages spikes in the shunt resistor voltage and LC resonance reactions cause unwanted oscillations in the shunt resistor voltage. This, in turn, disrupts the output voltage produced by the current sense amplifier. Notwithstanding these issues, conventional circuits rely on the output voltage waveform to be an amplified version of the shunt resistor voltage waveform, thereby exacerbating the problem.

Moreover, an outputted amplitude resulting from the aforementioned parasitic reaction is much greater than the shunt resistor voltage (I*Rshunt) in high-speed current switching applications, such as electric motor driving systems.

Furthermore, a voltage pulse waveform outputted by the shunt resistor distorts during a certain period after a rise due to ringing resulting from the switching. Consequently, measurement of a phase current cannot occur until after waiting for a predetermined time until the voltage stabilizes. This stabilization period is conventionally known as the (I*Rshunt) voltage setting time or current sense amplifier output voltage setting time. The setting time can be many microseconds and decreases effectiveness of the sensing circuit.

In high frequency PWM, multiphase, and DC/DC power switching applications, an impulse time of the load voltage, and consequently the impulse time of the load current, is usually less than the setting time. In other words, the load operates faster than the current sensing circuit can handle.

To resolve this problem, conventional techniques have attempted to lower the PWM frequency to lower the rate of change of the current. However, lowering the PWM frequency is impossible or impractical in many cases. For example, a PWM frequency below 20 kHz is audible and should be avoided.

Alternatively, conventional techniques have attempted to set a special current detection period for to compensate for the load current impulse time. Unfortunately, setting the special current detection period disturbs PWM control flow and increases torque ripple. Such conditions are unacceptable in certain systems, such as electronic power steering (EPS) systems, and the like.

As such, there are opportunities to address at least the aforementioned problems.

SUMMARY

One embodiment of a shunt current sensing circuit is provided. The circuit comprises a shunt resistor (Rshunt) for receiving a shunt current. A filtering stage is connected to the shunt resistor (Rshunt) and is configured to filter the shunt current. A current sense amplifier (U2) is connected to the filtering stage and is configured to receive the filtered shunt current from the filtering stage. The current sense amplifier (U2) is configured to sense the filtered shunt current to produce an output voltage. The filtering stage is configured to filter the shunt current such that the output voltage produced by the current sense amplifier (U2) is substantially proportional to the shunt current.

One embodiment of a circuit is provided. The circuit comprises a shunt resistor (Rshunt) configured to receive a shunt current. A filtering stage is connected to the shunt resistor (Rshunt) and comprises a first amplifier (U1) being configured to filter the shunt current. An amplification stage is connected to the filtering stage and comprises a second amplifier (U2) being configured to sense the filtered shunt current.

One embodiment of a method of operating a shunt current sensing circuit is provided. The circuit comprises a shunt resistor (Rshunt), a filtering stage connected to the shunt resistor (Rshunt), and a current sense amplifier (U2) connected to the filtering stage. The method comprises receiving a shunt current with the shunt resistor (Rshunt). The shunt current is filtered with the filtering stage. The filtered shunt current is received from the filtering stage with the current sense amplifier (U2). The filtered shunt current is sensed with the current sense amplifier (U2). An output voltage is produced with the current sense amplifier (U2) based on the sensed and filtered shunt current such that the output voltage is substantially proportional to the shunt current.

The circuits and methods provide high precision shunt current sensing for all switching (fast, slow, constant) speeds (dI/dt) of the shunt resistor current. The circuit thereby provides increased versatility because the circuit can be utilized for high-frequency current switching schemes, such as PWM, multiphase, and DC/DC power switching applications. Thus, systems utilizing the circuit can operate at much higher frequencies than previously practical.

Filtering the shunt current with the first amplifier (UI) such that the output voltage produced by the current sense amplifier (U2) is substantially proportional to the shunt current provides tremendous benefit. The output voltage of the current sense amplifier closely resembles (directly or inversely) the shunt current and is free of undesired artifacts on the voltage across the shunt resistor. That is, the output voltage is without parasitic voltage peaks, unwanted oscillations, and ringing. This provides increased precision and robustness in the output voltage produced by the current sense amplifier.

Furthermore, the reduction of such voltages peaks and ringing in the amplifier output voltage virtually eliminates any setting time because the phase current stabilizes rapidly. As such, sampling or measurement of the phase current may be performed at any desired time. This further allows the circuit and method to effectively handle load impulses in high frequency current switching sensing because the setting time is virtually eliminated. In other words, the load current impulse time exceeds the setting time because the setting time is substantially reduced to zero.

Therefore, the techniques described herein eliminate the need to lower the PWM frequency to lower the rate of change of the current or to set a special current detection period for to compensate for the load current impulse time. Those skilled in the art appreciate that the circuit and method may provide additional advantages beyond those described herein.

BRIEF DESCRIPTION OF THE DRAWINGS

Advantages of the present invention will be readily appreciated, as the same becomes better understood by reference to the following detailed description, when considered in connection with the accompanying drawings.

DETAILED DESCRIPTION

Referring to the Figures, wherein like numerals indicate like or corresponding parts throughout the several views, a circuit 10 and a method 100, 200 of operating the same are provided.

Figure 1:
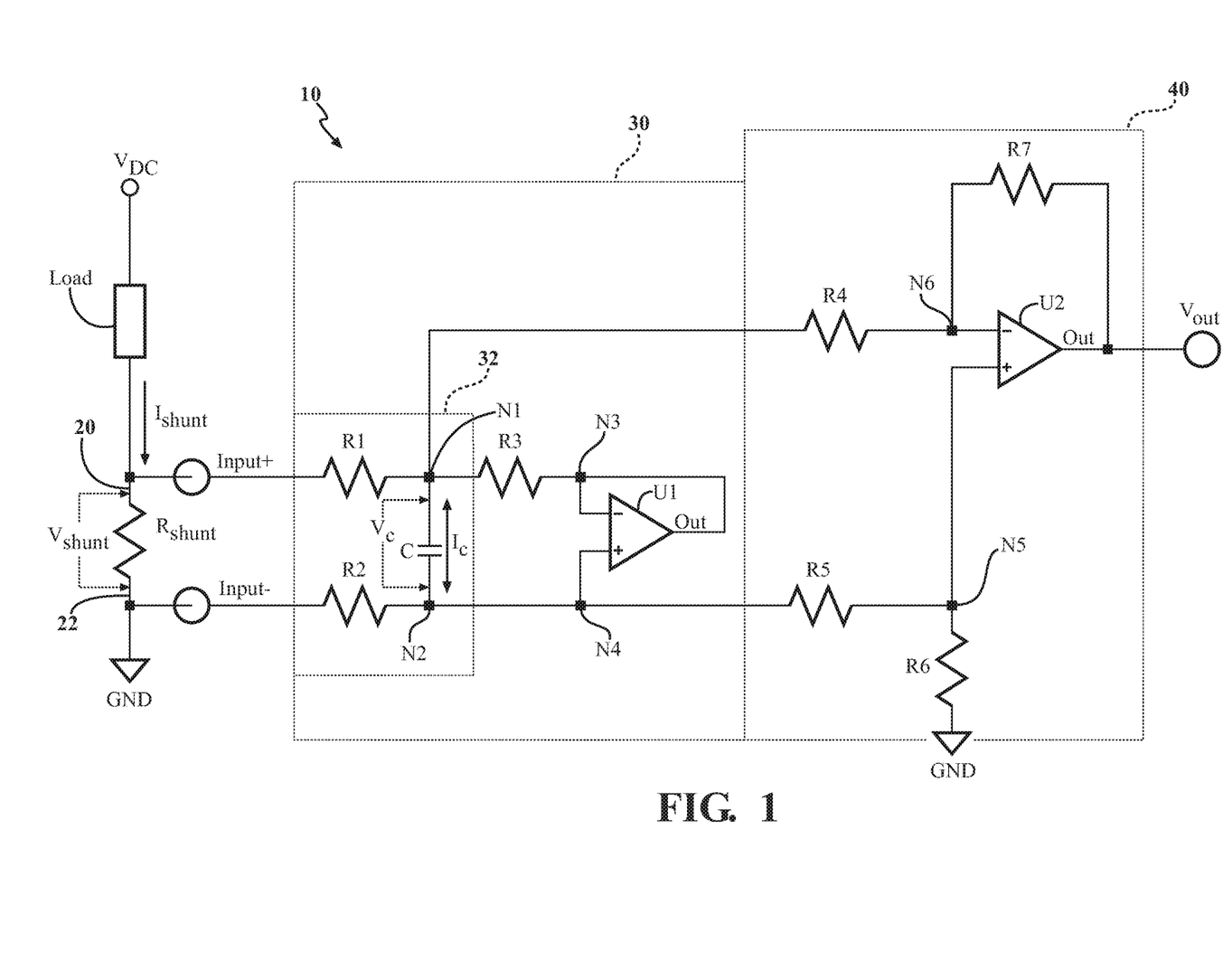
FIG. 1 is a schematic diagram of a shunt current sensing circuit comprising a shunt resistor, a filtering stage and an amplification stage, according to one embodiment.

The circuit 10 is utilized for shunt current sensing. As such, the circuit 10 may also be referred to as a shunt current sensing circuit. Generally, shunt current sensing involves measuring current through a shunt resistor (Rshunt), as shown in FIG. 1. The shunt resistor (Rshunt) receives a shunt current (Ishunt) that flows through the shunt resistor (Rshunt).

The shunt resistor (Rshunt) is disposed in series with a load (L). This allows current flowing through the load (L) to also flow through the shunt resistor (Rshunt). As such, the shunt resistor (Rshunt) effectively senses the load (L) current. In this sense, the shunt resistor (Rshunt) is effectively a current-sense resistor. The shunt current (Ishunt) is analogous to the load current. The shunt current (Ishunt) may have any ampere value suitable for current detection. In one example, the shunt current (Ishunt) is between 1 A and 20 A.

The circuit 10 connects to a voltage source, such as a DC voltage source (Vdc). The voltage source (Vdc) may connect to any suitable power source, such as a vehicle battery, or the like. The voltage source (Vdc) may have any suitable voltage, such as 12 volts, 26 volts, or the like. The shunt resistor (Rshunt) includes a high side 20 and a low side 22. As shown in FIG. 1, the high side 20 of the shunt resistor (Rshunt) connects to the voltage source (Vdc) and the low side 22 of the shunt resistor (Rshunt) connects to electrical ground (Gnd). Because the shunt resistor (Rshunt) is positioned between the load (L) and ground (Gnd) in FIG. 1, the circuit 10 employs low-side sensing of the load (L). However, it is to be appreciated that the shunt resistor (Rshunt) may alternatively be positioned between the load (L) and the voltage source (Vdc) such that the circuit 10 employs high-side sensing of the load (L).

The shunt resistor (Rshunt) may have any suitable configuration for facilitating precision current sensing. In one embodiment, the shunt resistor (Rshunt) is a manganin resistor having an accurately predetermined resistance. The shunt resistor (Rshunt) may also have any suitable resistive value for providing precision current sensing. However, to minimize circuit disruptions, the resistance of the shunt resistor (Rshunt) is normally very small, such as on the order of milli-Ohms. In one example, the shunt resistor (Rshunt) is in a range between 1 to 100 milli-Ohms.

As the shunt current (Ishunt) flows through the shunt resistor (Rshunt), a voltage drop occurs across the shunt resistor (Rshunt). This voltage drop is proportional to the shunt current (Ishunt) and may also be known as the sense voltage or shunt voltage (Vshunt). The shunt voltage (Vshunt) is measured in FIG. 1 between (Input+) at the high side 20 point of the shunt resistor (Rshunt) and (Input−) at the low side point 22 of the shunt resistor (Rshunt).

Because the resistance of the shunt resistor (Rshunt) is accurately predetermined, the techniques and circuitry described in detail below filter and scale the voltage drop (Vshunt) to accurately detect the shunt current (Ishunt).

As shown in FIG. 1, a first stage, or filtering stage 30, connects to the shunt resistor (Rshunt). The filtering stage 30 is provided for filtering the shunt current (Ishunt) to provide a filtered shunt current. It is to be appreciated that the filtering stage 30 may additionally or alternatively filter the shunt voltage (Vshunt) resulting from flow of the shunt current (Ishunt) through the shunt resistor (Rshunt).

In one embodiment, as shown in FIG. 1, the filtering stage 30 comprises an RC network or RC filter 32. The RC filter 32 comprises a resistor-capacitor circuit (RC circuit) driven by the voltage source (Vdc). Specifically, in FIG. 1, the RC filter 32 comprises a first resistor (R1), a second resistor (R2), and a capacitor (C).

The first resistor (R1) connects to the high side 20 of the shunt resistor (Rshunt). As such, the load (L), the high side 20 of the shunt resistor (Rshunt), and the first resistor (R1) connect to a common node. The first resistor (R1) may have any suitable resistance value. In one embodiment, the first resistor (R1) is approximately 10Ω.

The second resistor (R2) connects to the low side 22 of the shunt resistor (Rshunt). As such, the low side 22 of the shunt resistor (Rshunt), the second resistor (R2), and ground (Gnd) connect to a common node. The second resistor (R2) may have any suitable resistance value. In one embodiment, the second resistor (R2) is approximately the same as the first resistor (R1), e.g., 10Ω.

A high side of the capacitor (C) connects to the first resistor (R1) at a first node (N1). A low side of the capacitor (C) connects to the second resistor (R2) at a second node (N2). As such, the capacitor (C) is disposed in parallel with the shunt resistor (Rshunt). A voltage potential (Vc) is defined across the capacitor (C) as current (Ic) flows through the capacitor. The capacitor (C) voltage potential (Vc) is substantially proportional to the shunt current (Ishunt). As such, the capacitor voltage (Vc) may be the subject of filtering by the filtering stage 30. The capacitor (C) may have any suitable capacitance value. In one embodiment, the capacitor (C) is approximately 1 nF.

In one embodiment, the RC filter 32 functions as a low-pass filter. That is, the RC filter 32 defines a cut-off frequency (fc) allowing only low frequency signals e.g., from 0 Hz to the cut-off frequency (fc), to pass, while blocking or filtering frequency signals that are higher than the cut-off frequency (fc). To implement this cut-off, a reactance (Xc) of the capacitor (C) varies inversely with frequency, while the value of the resistor(s) (R1/R2) remains constant as the frequency changes. At low frequencies the capacitive reactance (Xc) is much greater compared to the resistive value of the resistor(s) (R1/R2). As such, the voltage potential (Vc) of the capacitor (C) becomes much greater than a voltage drop (Vr) developed across the resistor (s) (R1/R2). At high frequencies, the inverse occurs, wherein (Vc) is small and (Vr) is large due to the change in the capacitive reactance value (Xc).

Those skilled in the art appreciate that the configuration of the RC filter 32 is not limited to the specific configuration of R1, R2, and C as shown in FIG. 1. That is, alternative or additional components may be utilized. Furthermore, the RC filter 32 may employ other types of filtering besides low pass filtering. For example, the RC filter 32 may implement high-pass or band-pass filtering.

Advantageously, the filtering stage 30 comprises a first amplifier (U1) and a third resistor (R3), which are provided for advanced filtering of the shunt current (Ishunt) and/or shunt voltage (Vshunt), as will be described in detail below. In one embodiment, the filtering stage 30, via at least the first amplifier (U1) and the third resistor (R3), is configured to filter and/or convert the shunt voltage (Vshunt) to a waveform that corresponds directly to the shunt current (Ishunt).

The first amplifier (U1) comprises a first input (U1−), a second input (U1+) and an output (U1 out). The first amplifier (U1) may be any suitable amplifier, such as an operational or differential amplifier. The third resistor (R3) connects to the first input (U1−). The second node (N2) connects to the second input (U1+) of the first amplifier (U1). The output (U1 out) of the first amplifier (U1) connects to a third node (N3) shared among the third resistor (R3) and the first input (U1−). The third resistor (R3) connects between the input (U1−) and the third node (N3). The first amplifier (U1) and the third resistor (R3) collectively connect across the capacitor (C) in a parallel manner.

As shown in FIG. 1, an amplification stage 40 connects to the filtering stage 30 and comprises a second amplifier (U2), which is hereinafter referred to as the current sense amplifier. The current sense amplifier (U2) is configured to receive the filtered shunt current (Ishunt) and/or shunt voltage (Vshunt) from the filtering stage 30 and to sense the same to produce an output voltage (Vout). The output voltage (Vout) is used for shunt current (Ishunt) sensing, comparison, or feedback.

The current sense amplifier (U2) comprises a first input (U2−), a second input (U2+) and an output (U2 out). The output voltage (Vout) is provided at the output (U2 out) of the current sense amplifier (U2). The current sense amplifier (U2) may exhibit any suitable gain (K). Additionally, the current sense amplifier (U2) may be any suitable amplifier type, such as an operational or differential amplifier. In one example, the current sense amplifier (U2) is a linear op-amp implemented in a surface mounted integrated circuit.

With linear amplification, the output voltage (Vout) of the current sense amplifier (U2) is substantially proportional to the input into the current sense amplifier (U2). As described, the shunt resistor (Rshunt) converts the load current to the shunt voltage (Vshunt), which is very low due to the resistance of the shunt resistor (Rshunt). In one embodiment, the shunt voltage (Vshunt) mad be in the range between 1 mV to 100 mV, despite the presence of very large common-mode voltages. As such, the current sense amplifier (U2) may exhibit low input offset voltage and a high common-mode rejection ratio (CMRR). The current sense amplifier (U2) amplifies the shunt voltage (Vshunt). Therefore, the current sense amplifier (U2) may also comprise a high input impedance to minimize loading on the shunt resistor (Rshunt) and other components of the circuit 10.

The amplification stage 40 further comprises a fourth resistor (R4) and a fifth resistor (R5). The fourth resistor (R4) connects between the first node (N1) and the first input (U2−) of the current sense amplifier (U2). The fourth resistor (R4) may have any suitable resistance value. In one embodiment, the fourth resistor (R4) is approximately 100Ω.

The fifth resistor (R5) connects to a fourth node (N4) shared among the second input (U1+) of the first amplifier (U1) and the second node (N2). The fifth resistor (R5) may have any suitable resistance value. In one embodiment, the fifth resistor (R5) is the same as the fourth resistor (R4). e.g., 100Ω.

The fourth resistor (R4) and fifth resistor (R5) are respective input resistors to the first input (U2−) and second input (U2+) of the current sense amplifier (U2). As such, the first node (N1) is effectively coupled to the first input (U2−) while the second node (N2) is effectively coupled to the second input (U2+).

The amplification stage 40 further comprises a sixth resistor (R6) that connects to a fifth node (N5) shared among the firth resistor (R5) and the second input (U2+) of the current sense amplifier (U2). The sixth resistor (R6) also connects to electrical ground (Gnd). The sixth resistor (R6) may have any suitable resistance value. The amplification stage 40 further comprises a seventh resistor (R7) that connects between the output (U2 out) of the current sense amplifier (U2) and a sixth node (N6) shared among the fourth resistor (R4) and the first input (U2−) of the current sense amplifier (U2).

With reference to the circuit 10 configuration described above, additional operation of the circuit 10 to provide advanced filtering of the shunt current (Ishunt) is described below.

The circuit 10 is configured to provide high precision detection of the shunt current (Ishunt) for any suitable application involving current switching. Current switching involves alternating the load current, and consequently the shunt current (Ishunt), between high value and a low value. Typically, the shunt current (Ishunt) exhibits a ramping up to reach the high value and a ramping down to reach the low value. The slope of the shunt current (Ishunt) over time is also known as the speed of the shunt current (Ishunt) and is herein expressed as dI/dt, i.e., the derivative of the shunt current (Ishunt) with respect to time. The circuit 10 may provide high precision detection of the shunt current (Ishunt) in low-frequency switching applications. The circuit 10 may provide high precision detection of the shunt current (Ishunt) in high-frequency current switching schemes, including, but not limited to PWM, multiphase, and DC/DC power switching applications. The circuit 10 may also detect the shunt current (Ishunt) when the shunt current (Ishunt) is constant. i.e., does not switch.

Figure 2:
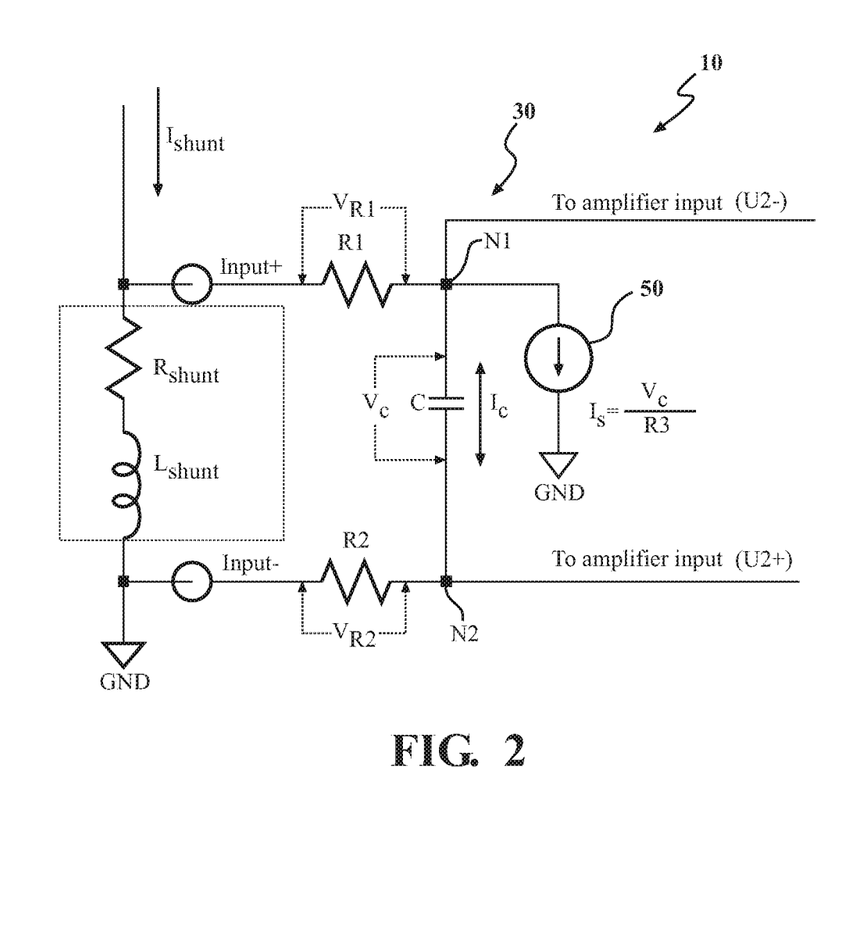
FIG. 2 is a schematic diagram of an equivalent representation of the shunt resistor and filtering stage of the shunt current sensing circuit of FIG. 1, according to one embodiment.

With reference to FIG. 2, an equivalent schematic of the shunt resistor (Rshunt) and the filtering stage 30 are provided. The shunt resistor (Rshunt) is expanded into an ohmic resistance component of the shunt resistor (Rshunt) and a shunt parasitic inductance (Lshunt) being disposed in serial connection. The shunt parasitic inductance (Lshunt) reaction is the unwanted result of fast current switching, such as current switching used in high frequency Pulse Width Modulation (PWM). Such fast current switching disturbs the shunt voltage (Vshunt) by introducing voltages spikes or unwanted oscillations in the shunt voltage (Vshunt). As such, reducing the shunt parasitic inductance (Lshunt) is one major focus of the filtering provided by the circuit 10, and more specifically, the filtering stage 30. The shunt voltage (Vshunt), i.e., the voltage between points "Input+" and "Input−" is expressed with respect to the equivalent circuit in FIG. 2 as follows:

$$V_{shunt} = I_{shunt} * R_{shunt} + L_{shunt} * \left(\frac{dI_{shunt}}{dt}\right) \quad [1]$$

The first amplifier (U1) and the third resistor (R3) are presented in an equivalent schematic as an equivalent current source 50 with output current depending on the voltage (Vc) across the capacitor (C). The output current (Is) of the equivalent current source 50 is equivalent to the current through the third resistor (R3) in FIG. 1. This output current (Is) is expressed in relation to the voltage across the capacitor (Vc) as follows:

$$I_s = \frac{V_c}{R_3} \quad [2]$$

In the equivalent schematic of FIG. 2, the shunt voltage (Vshunt) can therefore be computed by the sum of three voltages, i.e., the voltage (VR1) of the first resistor (R1), the voltage (Vc) of the capacitor (C) and the voltage (VR2) of the second resistor (R2). Accordingly, given the output current (Is) of the equivalent current source 50, the shunt voltage (Vshunt) can be expressed as follows, wherein (Ic) is the current through the capacitor (C):

$$= V_{R1} + V_C + V_{R2} \quad [3]$$
$$= R_1 * (I_C + I_s) + V_C + R_2 * I_C$$
$$= R_1 * \left[C * \left(\frac{dV_C}{dt}\right) + \left(\frac{V_C}{R_3}\right)\right] + V_C + R_2 * C * \left(\frac{dV_C}{dt}\right)$$

Equations [1] and [3], both defining the shunt voltage (Vshunt), can be expressed in combination as follows:

$$I_{shunt} * R_{shunt} + L_{shunt} * \left(\frac{dI_{shunt}}{dt}\right) = \quad [4]$$
$$R_1 * \left[C * \left(\frac{dV_C}{dt}\right) + \left(\frac{V_C}{R_3}\right)\right] + V_C + R_2 * C * \left(\frac{dV_C}{dt}\right)$$

Equation [4] can be resolved to present the equivalent capacitor voltage $$V_C + \left(\frac{dV_C}{dt}\right)$$

as function of shunt current $$L_{shunt} * \left(\frac{dI_{shunt}}{dt}\right)$$

as follows:

$$I_{shunt} * R_{shunt} + L_{shunt} * \left(\frac{dI_{shunt}}{dt}\right) = \quad [5]$$
$$R_1 * \left[C * \left(\frac{dV_C}{dt}\right)\right] + R_1 * \left(\frac{V_C}{R_3}\right) + V_C + R_2 * C * \left(\frac{dV_C}{dt}\right) =$$
$$V_C\left(1 + \frac{R_1}{R_3}\right) + C * (R_1 + R_2)\left(\frac{dV_C}{dt}\right)$$

From equation [5], a constant component of the shunt voltage (Vshunt) is expressed as follows:

$$I_{shunt} * R_{shunt} = V_C\left(1 + \frac{R_1}{R_3}\right) \quad [6]$$

Equation [6] can be expressed alternatively with respect to the capacitor voltage (Vc) as follows:

$$V_C = \frac{I_{shunt} * R_{shunt}}{\left(1 + \frac{R_1}{R_3}\right)} \quad [7]$$

A changing component of the shunt voltage (Vshunt) is expressed as follows:

$$L_{shunt} * \left(\frac{dI_{shunt}}{dt}\right) = C * (R_1 + R_2)\left(\frac{dV_C}{dt}\right) \quad [8]$$

Equation [8] can be expressed alternatively with respect to the equivalent capacitor voltage $$\left(\frac{dV_C}{dt}\right)$$

as follows:

$$\left(\frac{dV_C}{dt}\right) = \frac{\left(\frac{dI_{shunt}}{dt}\right) * L_{shunt}}{C * (R_1 + R_2)} \quad [9]$$

From here, a gain (K) for the filtering stage 30 is expressed as follows:

$$K = \frac{R_{shunt}}{\left(1 + \frac{R_1}{R_3}\right)} = \frac{L_{shunt}}{C*(R_1 + R_2)} \qquad |10|$$

$$V_C + \left(\frac{dV_C}{dt}\right)$$

In effect, the capacitor voltage is functionally proportional to the shunt resistor current (Ishunt) wherein this relationship and expressed as follows:

$$V_C + \left(\frac{dV_C}{dt}\right) = K\left[I_{shunt} + \left(\frac{dI_{shunt}}{dt}\right)\right] \qquad |11|$$

Accordingly, the filtering stage 30 provides the first amplifier (U1) and third resistor (R3) such that the output current (Is) of the current source 50 depends on the voltage across the capacitor (C). This allows the capacitor voltage $$V_C + \left(\frac{dV_C}{dt}\right)$$

to be proportional to the shunt resistor current (Ishunt). The voltage across the capacitor (C) provides input voltage for the current sense amplifier (U2). The current sense amplifier (U2) produces the output voltage (Vout) based on the input voltage received by the current sense amplifier (U2). Therefore, the filtering stage 30 is configured to filter the shunt current (Ishunt) such that the output voltage (Vout) produced by the current sense amplifier (U2) is substantially proportional to the shunt current (Ishunt).

Figure 3:
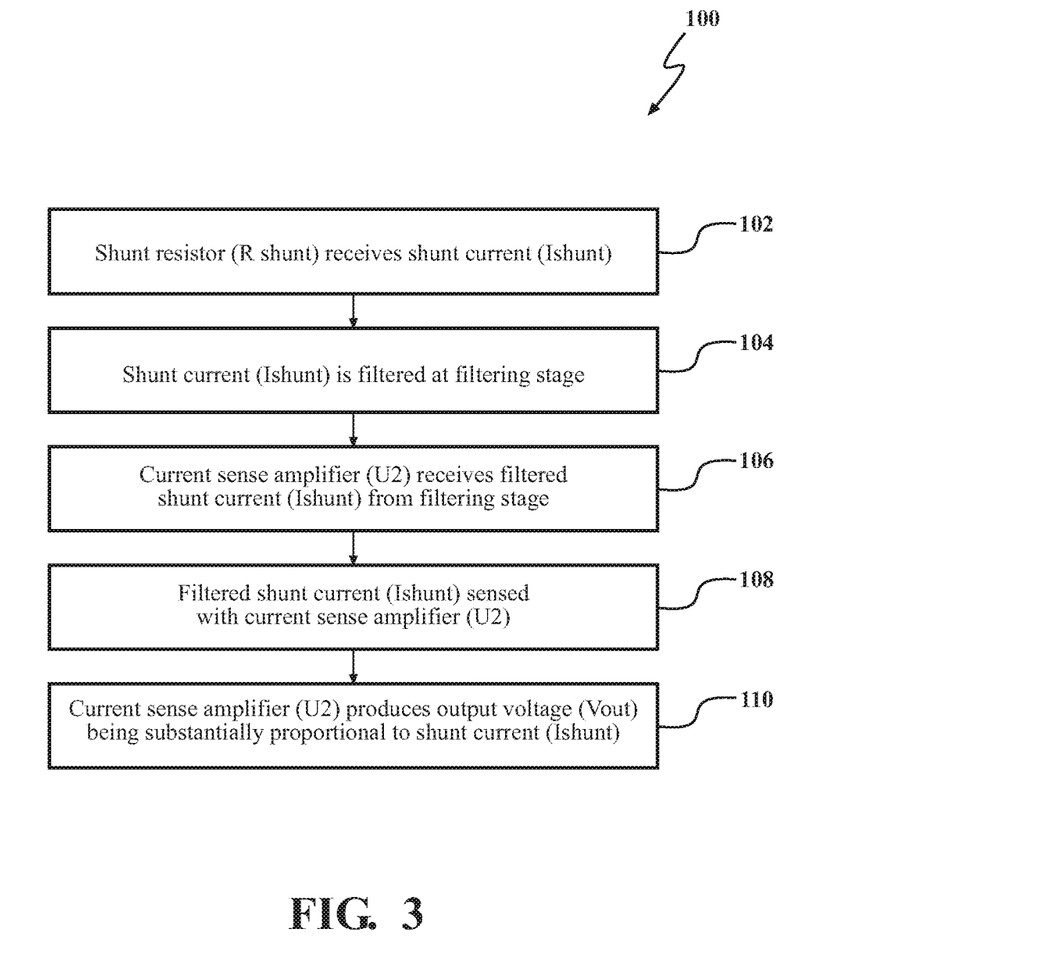
FIG. 3 is a method of operating the shunt current sensing circuit of FIG. 1, according to one embodiment.

FIG. 3 illustrates the steps of one embodiment of the method 100 of operating the shunt current sensing circuit 10 comprising the shunt resistor (Rshunt), the filtering stage 30 connected to the shunt resistor (Rshunt), and the current sense amplifier (U2) connected to the filtering stage 30.

At step 102, the shunt resistor (Rshunt) receives the shunt current (Ishunt). The shunt current (Ishunt) is filtered with the filtering stage 30, at step 104. At step 106, the current sense amplifier (U2) receives the filtered shunt current (Ishunt) from the filtering stage 30. At step 108, the filtered shunt current (Ishunt) is sensed with the current sense amplifier (U2). At step 110, the current sense amplifier (U2) produces the output voltage (Vout) based on the sensed and filtered shunt current (Ishunt) such that the output voltage (Vout) is substantially proportional to the shunt current (Ishunt).

Figure 4:
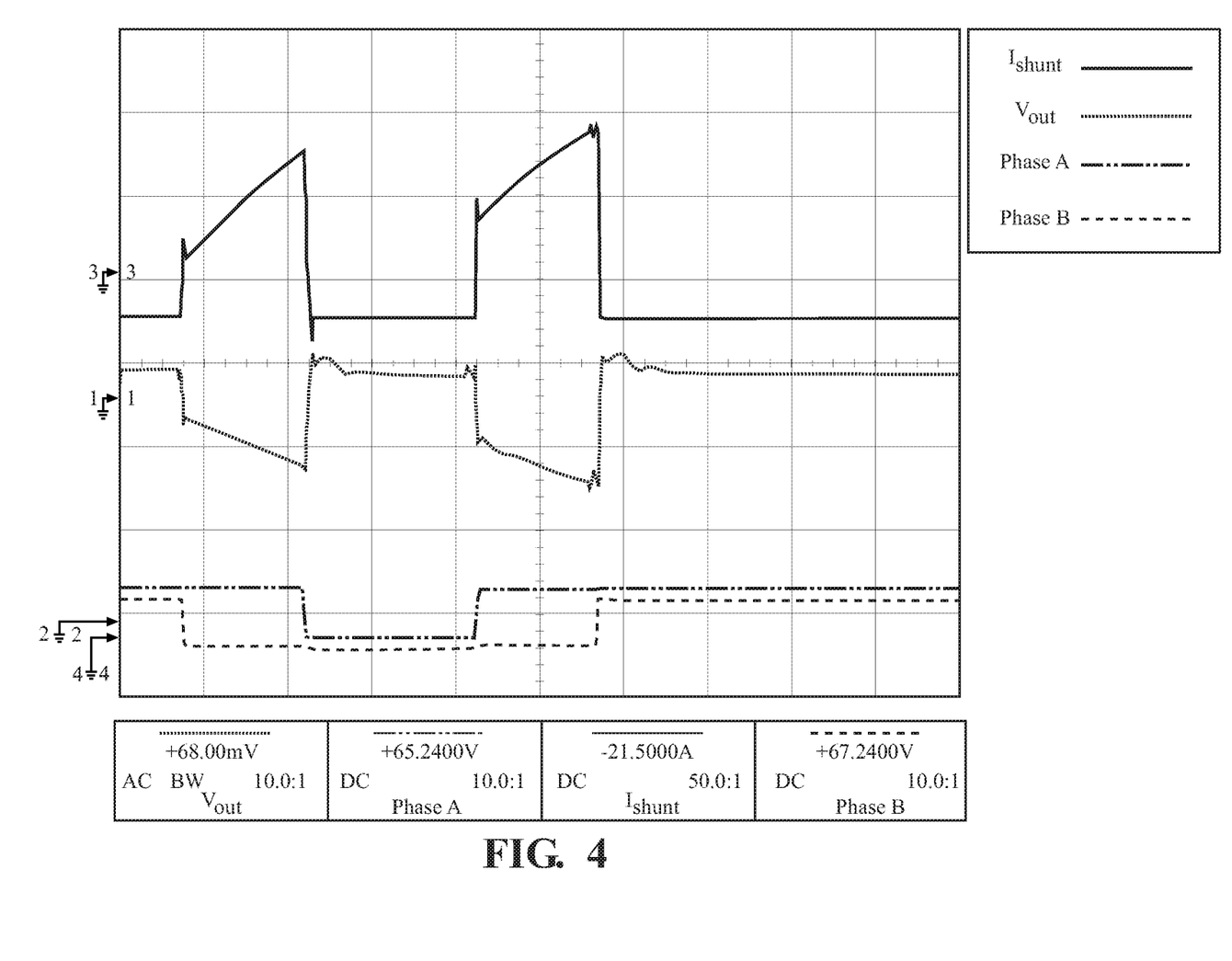
FIG. 4 is a chart comparing a current (Ishunt) through the shunt resistor and an output (Vout) of a current sense amplifier (U2) from the amplification stage, according to one embodiment.

FIG. 4 provides a chart illustrating the results of filtering the shunt current (Ishunt) in accordance with the techniques and circuits 10 described herein. FIG. 4 demonstrates that the output voltage (Vout) waveform is substantially proportional to the shunt resistor (Rshunt) current waveform (Ishunt). As used herein, the term "proportional" means that the output voltage (Vout) and the shunt current (Ishunt) waveforms are noticeably similar in shape or form. As will described below, such noticeably similar shapes or forms may be inverted versions of one another in some configurations. Mainly due to practical limitations, substantially proportional does not require that the waveforms of the output voltage (Vout) and the shunt current (Ishunt) be identical in shape. Mainly, the output voltage (Vout) and the shunt current (Ishunt) waveforms may be defined with respect to different units. For example, the output voltage (Vout) in FIG. 4 is defined with respect to milli-volts (mV) while the shunt current (Ishunt) is defined with respect to Amps (A). Additionally, the output voltage (Vout) and the shunt current (Ishunt) waveforms may be substantially proportional but be of different quantity or value such that the waveforms are not of identical quantity. For example, in FIG. 4, the output voltage (Vout) at 68 mV may correspond to and be substantially proportional to the shunt current (Ishunt) at 21 Amps.

In FIG. 4, the shunt current (Ishunt) waveform (top) was measured using a Rogowsky Coil. The current sense amplifier (U2) output (Vout) waveform (second from top) was measured using a differential probe. Phase A waveform (third from top) and Phase B waveform (bottom) are functions of the current switching applied to the load (L) via phase commutations, or the like. It is to be appreciated that sampling may be performed at any time after phase commutations.

Comparatively, the waveform of the current sense amplifier (U2) output (Vout) noticeably corresponds to the shunt resistor (Rshunt) current waveform (Ishunt). In one embodiment, the output voltage (Vout) waveform is substantially proportional to the shunt resistor (Rshunt) current waveform for all possible values of a derivative of the shunt current (Ishunt) with respect to time. i.e., dI shunt dt. In other words, the output voltage (Vout) waveform is substantially proportional to the shunt resistor (Rshunt) current waveform for any shunt current (Ishunt) waveform value.

$$\frac{dI_{shunt}}{dt}.$$

In other words, the output voltage (Vout) waveform is substantially proportional to the shunt resistor (Rshunt) current waveform for any shunt current (Ishunt) waveform value.

In FIG. 4, the output voltage (Vout) waveform is inversely related to the shunt current (Ishunt) waveform. In other words, as the output voltage (Vout) waveform value decreases, the shunt current (Ishunt) waveform increases, and vice-versa. As such, the shapes of the waveforms are noticeably similar but mirror images of one another in FIG. 4. The waveforms may opposingly increase or decrease at the same rate in this embodiment.

To illustrate this relationship in FIG. 4, the shunt resistor (Rshunt) current waveform is constant when Phase A and Phase B are high. The waveform ramps up when Phase B switches low, and continues to ramp up until phase A also switches low. The shunt resistor (Rshunt) current waveform is constant when Phase A and Phase B are both low. The waveform ramps up when Phase A switches high, and continues to ramp up until phase B switches high. This cycle continues as the current continues switching over time.

In this example, changes in the output voltage (Vout) waveform behave inversely from the shunt resistor (Rshunt) current waveform. Similar to the shunt current (Ishunt) waveform, the output voltage (Vout) waveform is constant when Phase A and Phase B are high. However, when the output voltage (Vout) waveform ramps down when Phase B switches low, and continues to ramp down until phase A also switches low. The output voltage (Vout) waveform is substantially constant when Phase A and Phase B are both low.

The output voltage (Vout) waveform ramps down when Phase A switches high, and continues to ramp down until phase B switches high.

Alternatively, the output voltage (Vout) waveform may be directly related to the shunt current ((shunt) waveform. In other words, as the output voltage (Vout) waveform value decreases, the shunt current (Ishunt) waveform decreases, and vice-versa. Similarly, as the output voltage (Vout) waveform value increases, the shunt current (Ishunt) waveform increases, and vice-versa. As such, the shapes of the waveforms are noticeably similar to one another (without inversion). The waveforms may commonly increase or decrease at the same rate in this embodiment.

Notably, the output voltage (Vout) waveform is not a filtered and amplified version of the shunt voltage (Vshunt) waveform. Having the output voltage (Vout) waveform correspond to the shunt voltage (Vshunt) waveform causes many of the aforementioned problems in the related art. Instead, the output voltage (Vout) waveform, produced according to the techniques described herein, is related directly to the shunt current (Ishunt) waveform. Accordingly, as demonstrated in at least FIG. 4, the output voltage (Vout) waveform is free of undesired artifacts. i.e., parasitic voltage peaks, unwanted oscillations, and ringing. This provides increased precision and robustness when using the output voltage (Vout) for sensing, feedback, or the like.

Figure 5:
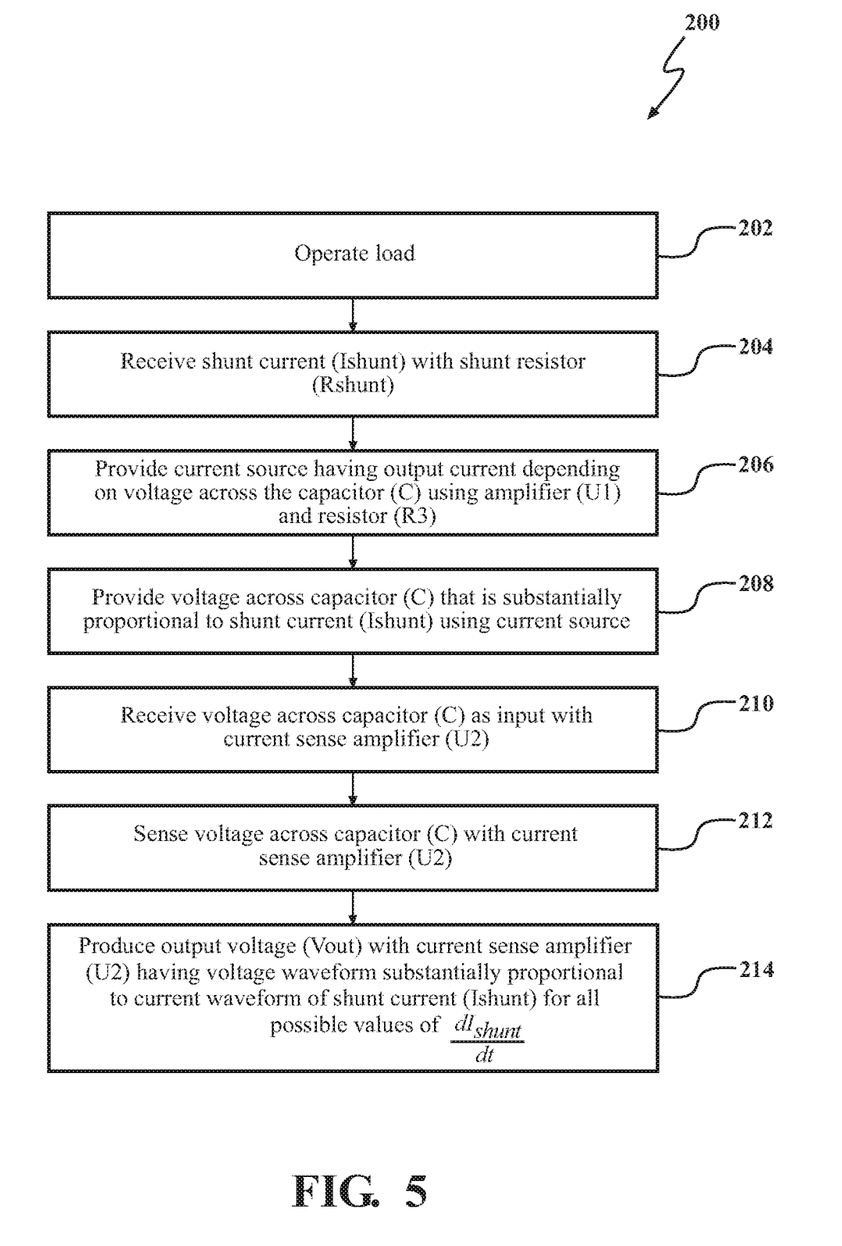
FIG. 5 is a method of operating the shunt current sensing circuit according to another embodiment.

FIG. 5 illustrates the steps of another embodiment of the method 200 of operating the shunt current sensing circuit 10. At step 202, the load (L) is operated. Current through the load (L) passess through the shunt resistor (Rshunt) such that the shunt resistor (Rshunt) receives the shunt current (Ishunt), at step 204. At step 206, the current source 50 is provided having the output current (Is) depending on voltage (Vc) across the capacitor (C) using amplifier (U1) and resistor (R3). The current source 50 provides the voltage (Vc) across the capacitor (C) such that (Vc) is substantially proportional to the shunt current (Ishunt) at step 208. At step 210, the current sense amplifier (U2) receives the voltage (Vc) across capacitor (C) as input. The current sense amplifier (U2) senses the voltage (Vc) across capacitor (C) at step 212. At step 214, the current sense amplifier (U2) produces the output voltage (Vout) having the voltage waveform being substantially proportional to the current waveform of shunt current (Ishunt) for all possible values of $$\frac{dI_{shunt}}{dt}.$$

The circuit 10 and methods 100. 200 provide high precision sensing for all switching (fast, slow, constant) speeds (dI/dt) applied to the shunt resistor current (Ishunt). The circuit 10 thereby provides increased versatility because the circuit 10 can be utilized for high-frequency current switching applications. Thus, systems utilizing the circuit 10 can operate at much higher frequencies than previously practical where the output voltage (Vout) waveform is otherwise derived from the shunt voltage (Vshunt) waveform.

Furthermore, the reduction of such voltages peaks and ringing in the output voltage (Vout) waveform virtually eliminates any setting time because the waveform rapidly stabilizes. This allows sampling or measurement of the shunt current (Ishunt) to be performed at any desired time.

Additionally, the circuit 10 and methods 100, 200 effectively handle load impulses in high frequency current switching sensing or in over-current protection schemes, such as closed circuit protection and shoot-through protection applications. Since the setting time is virtually reduced to zero, any load current impulse time will exceed the setting time. Therefore, the circuit 10 and method 100, 200 eliminate the need for additional configurations or techniques to compensate for the load current impulse time.

Those skilled in the art appreciate that any additional components not specifically recited herein may be added to the circuit 10 as described herein. Such components may include, for example, a comparator connected to the current sense amplifier (U2) for comparing the output voltage (Vout) to a threshold voltage or current, or the like.

Furthermore, the circuits 10 and methods 100, 200 described herein be utilized for any suitable application whereby shunt current detection is desired or needed. For example, such applications may include battering current sensing, hall effect sensing, or the like. Additionally, the circuits 10 and methods 100, 200 may be utilized as a sub-component of any system in a vehicle, such as power steering systems, position detection systems, seat systems, shifter assemblies, clutch position detection systems, motor driving systems, or the like. Those skilled in the art appreciate that the circuits 10 and methods 100, 200 may be used with any other application or system not specifically described herein.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A shunt current sensing circuit comprising: a shunt resistor configured to receive a shunt current;
   a filtering stage connected to said shunt resistor and comprising a capacitor disposed in parallel with said shunt resistor, said capacitor connected between a first node and a second node and wherein said filtering stage is configured to filter said shunt current, said filtering stage further comprises a third resistor and a first amplifier disposed in parallel manner with said capacitor, said first amplifier includes a first input, a second input, and a first output, said first output being directly connected to a third node shared with said first input, said second input directly connected to said second node, said third resistor directly connected between said first node and said third node, said first amplifier and said third resistor are configured to generate an output current dependent on a voltage defined across said capacitor, and wherein said voltage is substantially proportional to said shunt current, wherein said filtering stage is configured to reduce a parasitic inductance caused by a derivative of the shunt current with respect to time; and
   a current sense amplifier comprises a third input, a fourth input, and a second output, said current sense amplifier connected to said filtering stage and being configured to receive said filtered shunt current from said filtering stage and to sense said filtered shunt current to produce an output voltage;
   a first resistor directly connected between said first node and said third input of said current sense amplifier;

a second resistor directly connected between said second node and said fourth input of said current sense amplifier; and wherein said filtering stage is configured to filter said shunt current such that said output voltage produced by said current sense amplifier is substantially proportional to said shunt current.

2. The shunt current sensing circuit of claim 1 wherein said output voltage is further defined as being substantially proportional to said shunt current for all possible values of the derivative of said shunt current with respect to time.

3. The shunt current sensing circuit of claim 1 wherein said output voltage is further defined as being inversely related to said shunt current.

4. The shunt current sensing circuit of claim 1 wherein said output voltage comprises a voltage waveform and wherein said shunt current comprises a current waveform and wherein said output voltage being substantially proportional to said shunt current is further defined as said voltage waveform of said output voltage being substantially proportional to said current waveform of said shunt current.

5. The shunt current sensing circuit of claim 1 wherein said current sense amplifier is configured to sense said filtered shunt current in a switching pulse width modulated (PWM) mode.

6. The shunt current sensing circuit of claim 1 wherein a load connects between a voltage source and said shunt resistor and wherein said shunt resistor connects to electrical ground such that said current sense amplifier is a low-side current sense amplifier.

7. A circuit comprising:
a shunt resistor configured to receive a shunt current;
a filtering stage connected to said shunt resistor and comprising a capacitor and a first amplifier, said capacitor disposed in parallel with said shunt resistor, said capacitor connected between a first node and a second nod and wherein said filtering stage is configured to filter said shunt current, said filtering stage further comprises a third resistor and a first amplifier disposed in parallel manner with said capacitor, said first amplifier includes a first input, a second input, and a first output, said first output connects directly to a third node shared with said first input, said second input connects directly to said second node, said third resistor directly connected between said first node and said third node, said first amplifier and said third resistor are configured to generate an output current dependent on a voltage defined across said capacitor, and wherein said voltage is substantially proportional to said shunt current; and
an amplification stage connected to said filtering stage and comprising a second amplifier being configured to sense the filtered shunt current, said second amplifier comprises a third input, a fourth input and a second output, said third input is directly connected to said first node and said fourth input is directly connected to said second node.

8. The circuit of claim 7 wherein a high side of said shunt resistor connects to a voltage source and wherein a low side of said shunt resistor connects to electrical ground.

9. The circuit of claim 8 wherein said filtering stage further comprises an RC filter comprising a first resistor, a second resistor and said capacitor.

10. The circuit of claim 9 wherein said first resistor connects to a high side of said shunt resistor and wherein said second resistor connects to a low side of said shunt resistor.

11. The circuit of claim 10 wherein a high side of said capacitor connects to said first resistor at said first node and wherein a low side of said capacitor connects to said second resistor at said second node such that said capacitor is disposed in parallel with said shunt resistor.

12. The circuit of claim 7 wherein said amplification stage further comprises a fourth resistor and a fifth resistor.

13. The circuit of claim 12 wherein said fourth resistor connects between said first node and said first input of said second amplifier and wherein said fifth resistor connects to a fourth node shared among said second input of said first amplifier and said second node.

14. The circuit of claim 13 wherein said amplification stage further comprises a sixth resistor that connects to a fifth node shared among said fifth resistor and said second input of said second amplifier, and wherein said sixth resistor connects to electrical ground.

15. The circuit of claim 14 wherein said amplification stage further comprises a seventh resistor that connects between said output of said second amplifier and a sixth node shared among said fourth resistor and said first input of said second amplifier.

16. A method of operating a shunt current sensing circuit comprising a shunt resistor, a filtering stage connected to said shunt resistor and comprising a capacitor disposed in parallel with said shunt resistor, said capacitor connected between a first node and a second node and wherein said filtering stage is configured to filter said shunt current, said filtering stage further comprises a third resistor and a first amplifier disposed in parallel manner with said capacitor, said first amplifier includes a first input, a second input, and a first output, said first output being directly connected to a third node shared with said first input, said second input directly connected to said second node, said third resistor directly connected between said first node and said third node, a current sense amplifier comprises a third input, a fourth input, and a second output, said current sense amplifier connected to said filtering stage and being configured to receive said filtered shunt current from said filtering stage and to sense said filtered shunt current to produce an output voltage, a first resistor directly connected between said first node and said third input of said current sense amplifier, and a second resistor directly connected between said second node and said fourth input of said current sense amplifier, said method comprising:
receiving a shunt current with the shunt resistor;
producing a voltage across the capacitor that is substantially proportional to the shunt current;
filtering the shunt current depending on the voltage defined across the capacitor with the filtering stage, wherein filtering the shunt current includes reducing a parasitic inductance caused by a derivative of the shunt current with respect to time;
receiving the filtered shunt current from the filtering stage with the current sense amplifier;
sensing the filtered shunt current with the current sense amplifier; and
producing an output voltage with the current sense amplifier based on the sensed and filtered shunt current such that the output voltage is substantially proportional to the shunt current.

17. The method of claim 16 wherein the step of producing the output voltage is further defined as producing the output voltage such that the output voltage is substantially proportional to the shunt current for all possible values of the derivative of the shunt current with respect to time.

18. The method of claim 16 wherein the step of producing the output voltage is further defined as producing the output voltage such that the output voltage is inversely related to the shunt current.

19. The method of claim 16 wherein the output voltage comprises a voltage waveform and wherein the shunt current comprises a current waveform and wherein the step of producing the output voltage is further defined as producing the output voltage such that the voltage waveform of the output voltage is substantially proportional to the current waveform of the shunt current.

20. The method of claim 16 wherein the step of sensing the filtered shunt current is further defined as sensing the filtered shunt current in a switching pulse width modulated (PWM) mode.

* * * * *

UNITED STATES PATENT AND TRADEMARK OFFICE
CERTIFICATE OF CORRECTION

PATENT NO. : 11,099,216 B2  
APPLICATION NO. : 16/071264  
DATED : August 24, 2021  
INVENTOR(S) : Nikolai Panine It is certified that error appears in the above-identified patent and that said Letters Patent is hereby corrected as shown below:

In the Claims

Column 13, Lines 36-37 (Claim 7): delete "second nod" and insert therefor --second node--

Signed and Sealed this  
Twenty-fifth Day of January, 2022

Drew Hirshfeld  
*Performing the Functions and Duties of the*  
*Under Secretary of Commerce for Intellectual Property and*  
*Director of the United States Patent and Trademark Office*